US006956247B1

(12) United States Patent
Stockman

(10) Patent No.: US 6,956,247 B1
(45) Date of Patent: Oct. 18, 2005

(54) SEMICONDUCTOR LIGHT EMITTING DEVICE INCLUDING PHOTONIC BAND GAP MATERIAL AND LUMINESCENT MATERIAL

(75) Inventor: Stephen A. Stockman, Morgan Hill, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 10/855,292

(22) Filed: May 26, 2004

(51) Int. Cl.[7] .......................................... H01L 31/0232
(52) U.S. Cl. .......................................... 257/98; 257/94
(58) Field of Search ............................. 257/13, 94, 98

(56) References Cited

U.S. PATENT DOCUMENTS 4,882,617 A * 11/1989 Vriens ........................ 348/779

| | | |
|---|---|---|
| 5,813,752 A | 9/1998 | Singer et al. |
| 6,155,699 A | 12/2000 | Miller et al. |
| 6,274,924 B1 | 8/2001 | Carey et al. |
| 6,380,551 B2 * | 4/2002 | Abe et al. ...................... 257/15 |
| 6,795,463 B2 * | 9/2004 | Koyama et al. ............... 372/39 |
| 6,847,173 B2 * | 1/2005 | Berthou et al. ........... 315/169.3 |

* cited by examiner

Primary Examiner—Allan R. Wilson
(74) Attorney, Agent, or Firm—Patent Law Group LLP

(57) ABSTRACT

A light emitting structure includes a semiconductor light emitting device capable of emitting first light having a first peak wavelength, a luminescent material capable of emitting second light having a second peak wavelength disposed over the semiconductor light emitting device, and a photonic band gap material disposed between the light emitting device and the luminescent material. The photonic band gap material is capable of transmitting the first light and reflecting the second light, regardless of the angle of incidence of the first and second light.

29 Claims, 5 Drawing Sheets

SEMICONDUCTOR LIGHT EMITTING DEVICE INCLUDING PHOTONIC BAND GAP MATERIAL AND LUMINESCENT MATERIAL

BACKGROUND

1. Field of Invention

The present invention relates to semiconductor light emitting devices with a photonic band gap material disposed between the device and a luminescent material layer.

2. Description of Related Art

Semiconductor light emitting devices such as light emitting diodes (LEDs) are among the most efficient light sources currently available. Material systems currently of interest in the manufacture of high brightness LEDs capable of operation across the visible spectrum include group III–V semiconductors, particularly binary, ternary, and quaternary alloys of gallium, aluminum, indium, and nitrogen, also referred to as III-nitride materials; and binary, ternary, and quaternary alloys of gallium, aluminum, indium, and phosphorus, also referred to as III-phosphide materials. Often III-nitride devices are epitaxially grown on sapphire, silicon carbide, or III-nitride substrates and III-phosphide devices are epitaxially grown on gallium arsenide or gallium phosphide by metal organic chemical vapor deposition (MOCVD), molecular beam epitaxy (MBE), or other epitaxial techniques. The devices include an active, light emitting region sandwiched between an n-type region and a p-type region. Electrical contacts are provided on the n- and p-type regions.

The color of light emitted from a semiconductor light emitting device may be altered by placing a wavelength-converting material in the path of the light exiting the chip. The wavelength-converting material may be, for example, a phosphor. Phosphors are luminescent materials that can absorb an excitation energy (usually radiation energy) and store this energy for a short period of time. The stored energy is then emitted in the form of a photon of a different energy than the initial excitation energy. For example, "down-conversion" refers to a situation where the emitted photons have less energy than the excitation photon energy. The photon wavelength increases (since $E=hc/\lambda$), shifting the color of the light towards red.

FIG. 1 illustrates a prior art phosphor-converted LED 10 based on gallium nitride (GaN), described in more detail in U.S. Pat. No. 6,155,699 to Miller et al. The LED 10 includes a GaN die 12 that generates blue primary light when activated. The GaN die 12 is positioned on a reflector cup lead frame 14 and is electrically coupled to leads 16 and 18. The leads 16 and 18 provide electrical power to the GaN die 12. The GaN die 12 is covered by a region 20 of phosphorescent material. The type of phosphorescent material utilized to form the region 20 can vary, depending upon the desired color of secondary light that will be generated by the region 20. The GaN die 12 and the phosphorescent region 20 are encapsulated by a lens 22. The lens 22 is typically made of a transparent epoxy.

In operation, electrical current is supplied to the GaN die 12 to activate the GaN die. When activated, the GaN die 12 emits the primary light, i.e., blue light, away from the top surface of the GaN die 12. The emitted primary light is absorbed by the phosphorescent region 20. The phosphorescent region 20 then emits secondary light, i.e., the converted light having a longer peak wavelength, in response to absorption of the primary light. The secondary light is emitted randomly in various directions by the phosphorescent region 20. Some of the secondary light is emitted away from the GaN die 12, propagating through the lens 22 and exiting the LED 10 as output light. The lens 22 directs the output light in a general direction indicated by arrow 24.

However, some of the secondary light is emitted from the phosphorescent region 20 toward the GaN die 12. The amount of secondary light that is emitted toward the GaN die 12 may be as much as half of the generated secondary light. Much of this light is then absorbed by the semiconductor layers and contact metals within GaN die 12. Therefore, the amount of secondary light that eventually escapes the LED 10 as output light is significantly reduced. The maximum external conversion efficiency of typical prior art LEDs, such as the LED 10, has been estimated to be about 60%. The maximum external conversion efficiency is the percentage of output light with respect to the emitted primary light.

U.S. Pat. No. 5,813,752 to Singer et al. describes a phosphor conversion LED that includes a "short wave pass" (SWP) filter to mitigate the above-described cause of inefficiency. The Singer et al. LED is virtually identical to the LED 10, except that the SWP filter is positioned on the upper surface of the GaN die 12, sandwiched between the GaN die 12 and the phosphorescent region 20. The SWP filter transmits the primary light from the GaN die 12, but reflects a portion of the secondary light emitted from the phosphorescent region 20. Therefore, the portion of secondary light that is emitted toward the GaN die 12 from the phosphorescent region 20 is reflected by the SWP filter and transmitted through the lens 22, contributing to the total output light. The reflecting of the secondary light by the SWP filter is designed to increase external conversion efficiency.

A concern with the Singer et al. LED is that the SWP filter does not have well-behaved transmittance and reflectance characteristics to efficiently transmit and reflect the primary light and the secondary light over a range of angles, respectively. Ideally, the SWP filter should operate to transmit all of the primary light from the GaN die 12 to the phosphorescent region 20 and reflect all of the secondary light that is emitted back toward the GaN die 12 from the phosphorescent region 20. The concern stems from the fact that the emitted primary light impinges upon the SWP filter with a large range of incident angles. The incident angle is the angle measured from the propagating direction of the incident light to the normal, a perpendicular line with respect to the surface of the SWP filter. The SWP filter exhibits a strong angular dependency, and the large range of incident angles results in undesirable transmittance and reflectance characteristics. In particular, the SWP filter reflects a significant portion of the primary light generated within the GaN die and emitted toward the SWP filter at high incidence angles back into GaN die 12. Therefore, that portion of the emitted primary light will not be transmitted through the SWP filter to the phosphorescent region 20. The decrease in the amount of primary light transmitted through the SWP filter consequently decreases the amount of primary light that can be converted by the phosphorescent region 20. Thus, the amount of secondary light generated by the phosphorescent region 20 is also reduced. The overall effect is that the amount of output light from the Singer et al. LED has been reduced by the less than optimal rate of transmittance of the SWP filter.

Miller et al. proposes a solution to the problems presented by Singer et al., shown in FIG. 2. The GaN die 12 is covered by an encapsulating layer 28 made of a transparent material. The transparent material may be clear epoxy or glass. The encapsulating layer 28 is a dome-shaped structure that surrounds the die 12. In the preferred embodiment of Miller et al., the dome-shaped structure is a generally hemispheric structure having a radius that equals the distance from A to C. The distance from A to C is equal to or greater than three times the distance from A to B. Adjacent to the encapsulating layer 28 is a distributed Bragg reflector (DBR) mirror 30. Because the DBR mirror 30 is formed over the upper surface of the encapsulating layer 28, the DBR mirror 30 is a dome-shaped shell. A layer 36 of phosphorescent material is located over the DBR mirror 30. The DBR mirror allows much of the primary light to be transmitted through the DBR mirror to the phosphorescent layer. The amount of primary light transmitted through the DBR mirror depends on the transmittance characteristic of the DBR mirror. Moving the DBR mirror some distance away from the GaN die decreases the range of incident angles. The small range of incident angles increases the transmittance of the primary light.

There are several problems with the design proposed by Miller et al. First, though spacing DBR mirror 30 apart from die 12 may decrease the range of incident angles, Miller's DBR 30 still transmits primary light only in a limited range of angles of incidence. Second, Miller's DBR 30 reflects secondary light emitted by Miller's phosphorescent material layer 36 only in a limited range of angles of incidence. Since light is emitted by phosphorescent material layer 36 in random directions, a significant portion of the secondary light may be transmitted by DBR 30 into die 12 and absorbed. Third, the thickness of the layers of Miller's DBR 30 must be precisely controlled in order to achieve the desired reflectance and transmittance characteristics. Since DBR 30 is formed on a curved surface, fabrication of DBR 30 with the thickness control required may be difficult and expensive. Fourth, since Miller's DBR 30 is spaced apart from die 12, the source size of Miller's is undesirably larger than a device without DBR 30, limiting the range of practical applications of Miller's device.

SUMMARY

In accordance with embodiments of the invention, a light emitting structure includes a semiconductor light emitting device capable of emitting first light having a first peak wavelength, a luminescent material capable of emitting second light having a second peak wavelength disposed over the semiconductor light emitting device, and a three dimensional photonic band gap material disposed between the light emitting device and the luminescent material. The photonic band gap material is capable of transmitting the first light and reflecting the second light, regardless of the angle of incidence of the first and second light.

DETAILED DESCRIPTION

Figure 1:
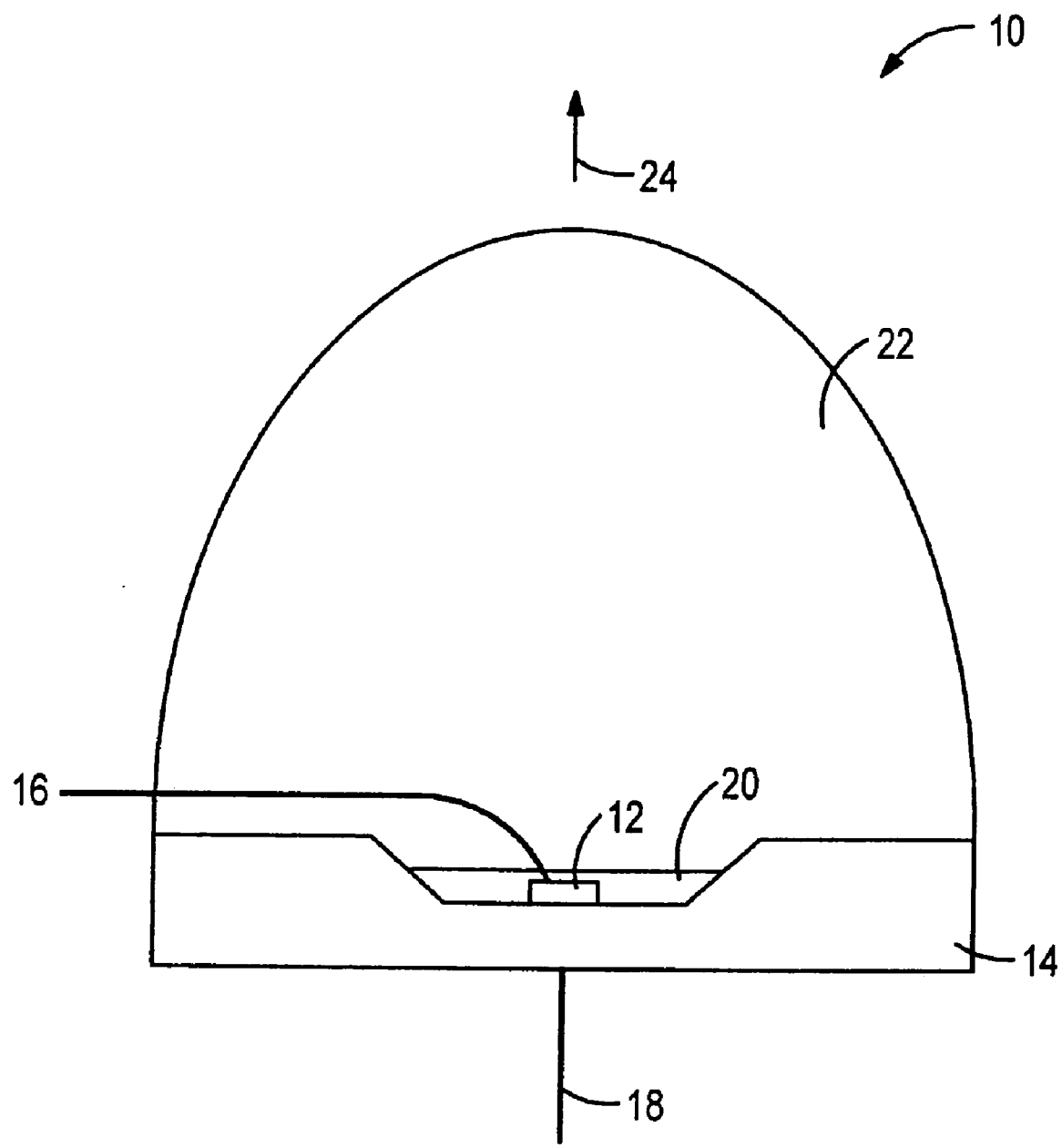
FIGS. 1 and 2 illustrate prior art phosphor-converted light emitting devices.
Figure 2:
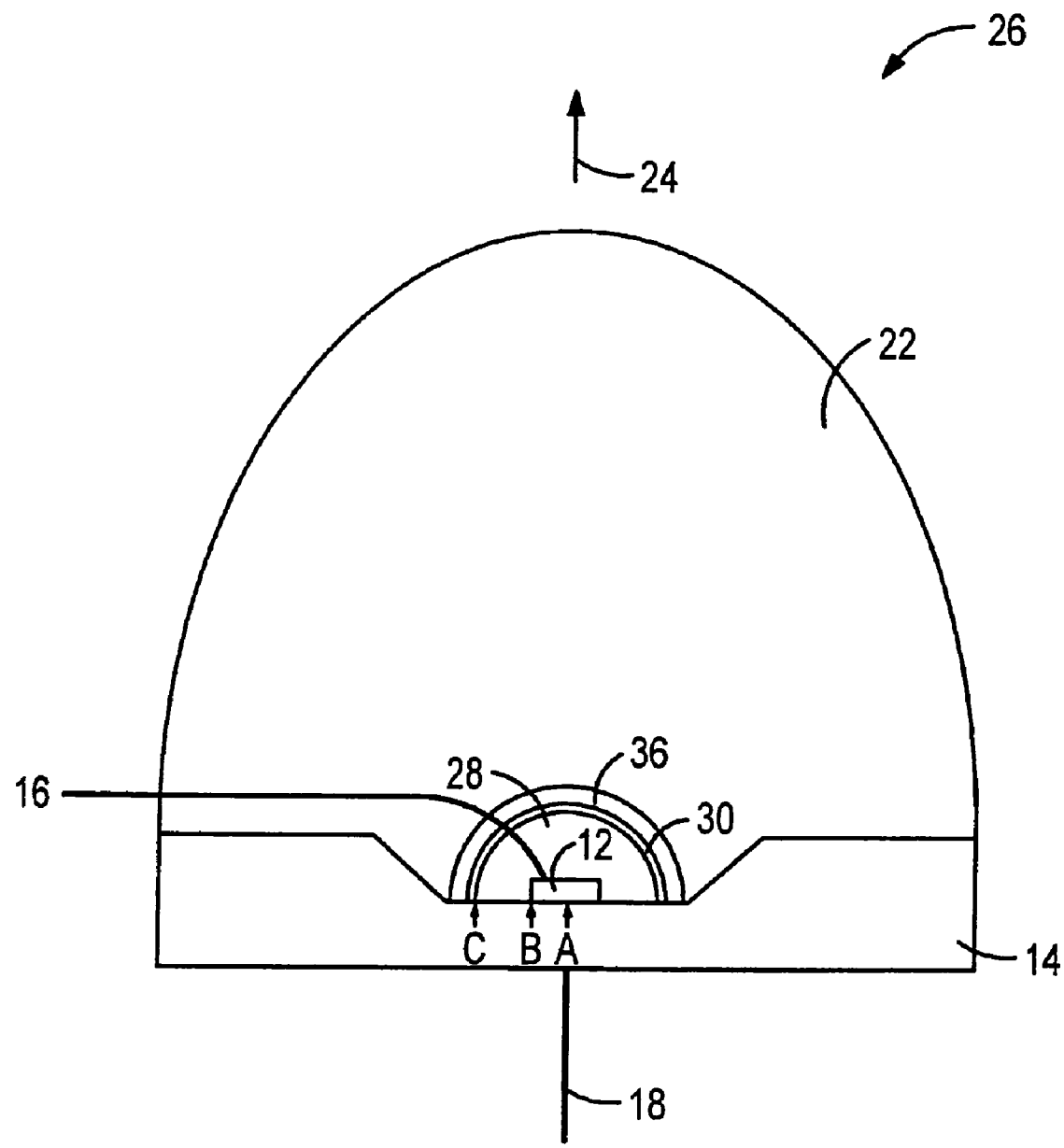
Figure 3:
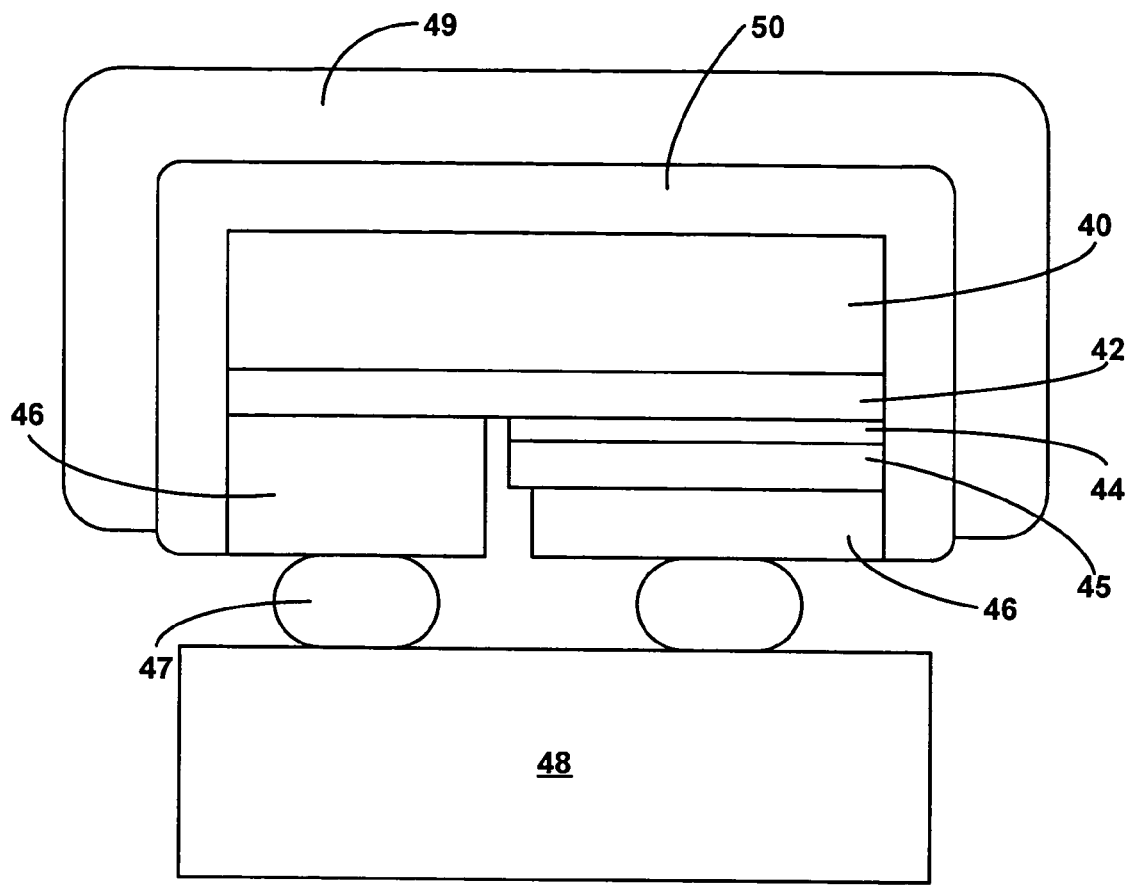
FIG. 3 is a cross sectional view of a light emitting device according to embodiments of the invention.

FIG. 3 illustrates a light emitting structure according to embodiments of the invention. A flip chip semiconductor light emitting device includes a substrate 40, an n-type region 42, and active, light emitting region 44, and a p-type region 45. Contacts 46 connect to the p- and n-type regions and electrically and physically connect the device to a mount 48 via interconnections 47.

A luminescent material layer 49 is disposed over the light emitting device. Luminescent material layer 49 is any suitable material capable of absorbing light emitted by active region 44 and converting that light to light of a different wavelength. Usually, luminescent layer 49 includes a phosphor material as the luminescent material, though other luminescent materials such as organic dyes may be used. Luminescent material layer 49 may include more than one luminescent material, as well as other materials that are not luminescent. Luminescent material layer 49 may include one or more phosphors deposited as slurries in a resin or other transparent material; deposited as thin films by, for example, electron beam evaporation, thermal evaporation, rf-sputtering, chemical vapor deposition, or atomic layer epitaxy; or deposited as conformal layers over LED 1 by, for example, screen printing, stenciling as described in U.S. Pat. No. 6,650,044, or by electrophoretic deposition as described in U.S. Pat. No. 6,576,488. Thin films are described in more detail in U.S. Pat. No. 6,696,703. Each of U.S. Pat. No. 6,696,703, U.S. Pat. No. 6,650,044 and U.S. Pat. No. 6,576,488 are incorporated herein by reference.

A two- or three-dimensional photonic band gap (PBG) material 50 is disposed between the light emitting device and luminescent material layer 49. Photonic band gap material 50 includes a periodic variation in index of refraction, in two or three dimensions. The periodic variation affects the way light propagates through the photonic band gap material, resulting in a range of allowed energies in the photonic band gap material, often expressed as an energy band diagram including energy bands, or photonic bands, separated by band gaps. Photons with energies in the photonic bands can propagate in the photonic band gap material, while photons with energies in the band gap cannot. These photons are reflected. Photonic band gap material 50 is selected and formed such that wavelengths of light emitted by the active region are within the photonic bands, and wavelengths of light emitted by the luminescent material are within the photonic band gaps. Photonic band gap material 50 thus transmits wavelengths of light emitted by active region 44, while reflecting wavelengths of light emitted by luminescent material layer 49. The appropriate wavelengths of light are transmitted and reflected regardless of the incidence angle of the light.

The photonic band gap material may be, for example, polystyrene spheres arranged in a lattice, such that the index of refraction varies periodically from the index of the spheres to the index of the air or other material between the spheres. Polystyrene spheres may be deposited on the surface of the light emitting device out of solution. In other examples, the photonic band gap material is a periodic array of holes filled with air or another material formed in multiple layers of a material that does not absorb light, such as a crystalline, glass, or dielectric material, such that the index of refraction varies periodically from the index of the main material to the index of air or other material filling the holes. The periodic arrays of holes in each layer may be offset in order to create a three dimensional variation in index of refraction. Crystalline photonic band gap materials may be epitaxially grown and patterned in multiple layers using conventional techniques. Glass or dielectric photonic band gap materials may be deposited then patterned in multiple layers using conventional techniques. In some embodiments, a glass or dielectric material may be deposited with, for example, polystyrene spheres within the layer, then etched to remove the spheres in order to form a periodic array of holes. Changing the periodic variation, for example by changing the size or periodicity of the spheres or the holes, introduces new energy levels. The allowed and forbidden wavelengths can thus be engineered by properly choosing the lattice constant of the periodic variation in index of refraction. A suitable photonic band gap material may include, for example, one layer of spheres or one crystalline, dielectric, or glass layer with a periodic array of holes for a two-dimensional photonic band gap material, or multiple layers of spheres or multiple layers of crystalline, dielectric, or glass layers with periodic arrays of holes for a three-dimensional photonic band gap material. The periodicity of the photonic band gap material may be on the order of about $\lambda/4$, where $\lambda$ is the effective wavelength of the secondary light within the photonic band gap material. In some embodiments, the two- or three-dimensional photonic band gap material may exhibit cubic or hexagonal symmetry.

The photonic band gap material is selected to be highly transmissive of primary light emitted by the active region, and at least partially reflective of secondary light emitted by the luminescent material layer. If the photonic band gap material is even modestly reflective of secondary light, the efficiency of the device may be much improved over a device lacking a photonic band gap material. In some embodiments, the photonic band gap material is at least 90% transmissive of primary light, and at least 50% reflective of secondary light. The photonic band gap is more preferably at least 90% reflective of secondary light.

Figure 4:
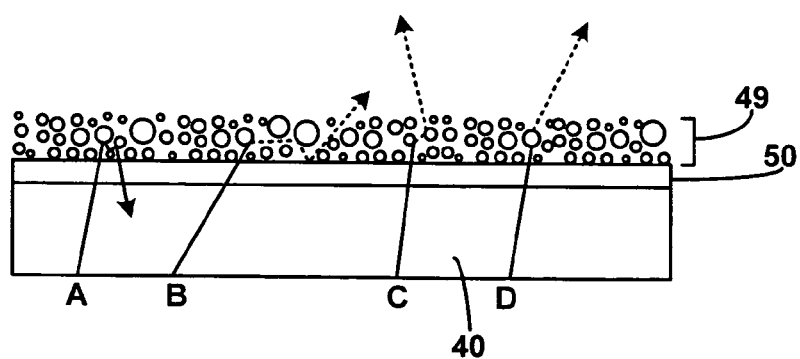
FIG. 4 is a cross sectional view of a portion of the device illustrated in FIG. 3.

FIG. 4 illustrates the behavior of four light rays in the device illustrated in FIG. 3. Solid lines in FIG. 4 illustrate unconverted light from the active region of the device, while dashed lines illustrate light converted by luminescent material layer 49. Ray A is emitted by the active region, transmitted through photonic band gap material 50, scattered by particles in luminescent material layer 49 without being converted until it is incident on photonic band gap material 50 again. Since ray A has not been converted, it is transmitted back through photonic band gap material 50 into the device, where it may be absorbed. Ray B is emitted by the active region and transmitted through photonic band gap material 50, where it is incident on a particle in luminescent material layer 49 that absorbs ray B and emits it as converted light. The converted ray B is scattered through luminescent material layer 49 until it is incident on photonic band gap material 50. Since ray B has been converted, it has a wavelength that is reflected by photonic band gap material 50 at any angle of incidence. Ray B is thus prevented from reentering the device, where it may be absorbed. Rays C and D are emitted by the active region and transmitted through photonic band gap material 50, where they are incident on particles in luminescent material layer 49 that absorb them and emit them as converted light. Rays C and D then exit the luminescent material directly (D) or after additional scattering (C). As illustrated in FIG. 4, when a photonic band gap structure is used, unconverted light may still be scattered back into the device. However, converted light scattered toward the device is reflected, potentially reducing optical loss and increasing the overall efficiency of the device.

In some embodiments, a photonic band gap material may be used in a wavelength converted device that emits a single color of light, such as device combining an active region that emits UV light with a single phosphor that emits red, green, or blue light, or a device combining an active region that emits blue light with a single phosphor that emits red or green light. In devices that emit a single color of light, the luminescent material layer is often configured such that less than 10% of the light emitted by the active region escapes the device unconverted by the luminescent material.

In some embodiments, a photonic band gap material may be used in a wavelength converted device emitting white light, such as device combining an active region that emits UV light with two or three or more phosphors, for example blue- and yellow-emitting phosphors in a two phosphor system and blue-, yellow- or green-, and red-emitting phosphors in a three phosphor system. In a white light device with an active region that emits UV light, the luminescent material layer may be configured such that less than 10% of the light emitted by the active region escapes the device unconverted by the luminescent material. In a white light device with an active region that emits blue light, the luminescent material layer may be configured such that a portion of the light emitted by the active region, for example, less than 50%, escapes the device unconverted by the luminescent material, such that the unconverted fraction of light emitted by the active region combines with light emitted by the luminescent material layer such that the combined light appears white.

In embodiments with multiple phosphor layers, the phosphors may be mixed or formed in discrete layers, as described in application Ser. No. 10/785,616, filed Feb. 23, 2004, and incorporated herein by reference. Each of the phosphors may be excited by either the light emitted by the active region or by light emitted by other phosphor layers. The properties of the photonic band gap material are selected to reflect light emitted by each of the phosphors. In some embodiments, additional photonic band gap materials may be disposed between separate phosphor layers.

Examples of suitable yellow- or green-emitting phosphors include $(Lu_{1-x-y-a-b}Y_xGd_y)_3(Al_{1-z}Ga_z)_5O_{12}:Ce_a^{3+}Pr_b^{3+}$ wherein $0<x<1$, $0<y<1$, $0<z\leq0.1$, $0<a\leq0.2$ and $0<b\leq0.1$ including, for example, $Lu_3Al_5O_{12}:Ce^{3+}$ and $Y_3Al_5O_{12}:Ce^{3+}$; $(Sr_{1-a-b}Ca_bBa_c)Si_xN_yO_z:Eu_a^{2+}$ (a= 0.002–0.2, b=0.0–0.25, c=0.0–0.25, x=1.5–2.5, y=1.5–2.5, z=1.5–2.5) including, for example, $SrSi_2N_2O_2:Eu^{2+}$; $(Sr_{1-u-v-x}Mg_u Ca_vBa_x)(Ga_{2-y-z}Al_yIn_zS_4):Eu^{2+}$ including, for example, $SrGa_2S_4:Eu^{2+}$; and $Sr_{1-x}Ba_xSiO_4:Eu^{2+}$. Examples of suitable red-emitting phosphors include $(Ca_{1-x}Sr_x)S:Eu^{2+}$ wherein $0<x\leq1$ including, for example, $CaS:Eu^{2+}$ and $SrS:Eu^{2+}$; and $(Sr_{1-x-y}Ba_xCa_y)_{2-z}Si_{5-a}Al_aN_{8-a}O_a:Eu_z^{2+}$ wherein $0\leq a<5$, $0<x\leq1$, $0\leq y\leq1$, and $0<z\leq1$ including, for example, $Sr_2Si_5N_8:Eu^{2+}$. Examples of suitable blue-emitting phosphors include, for example, $MgSrSiO_4$.

Figure 5:
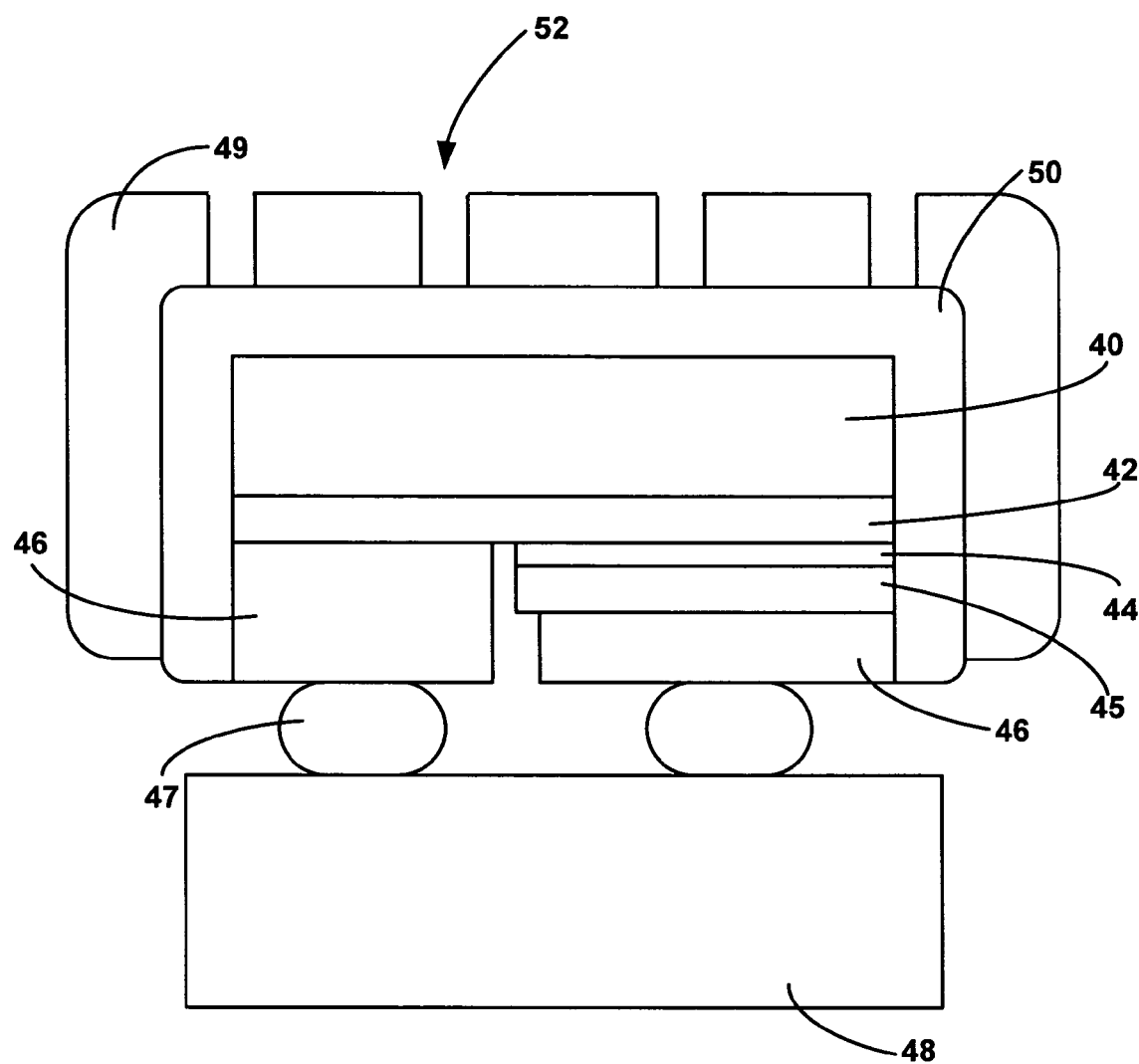
FIG. 5 is a cross sectional view of a light emitting device according to embodiments of the invention.

FIG. 5 illustrates an embodiment of the invention where luminescent material layer 49 is patterned to allow unconverted light to escape the device. The characteristics of the luminescent material layer and the ratio of covered surface to uncovered surface may be selected to control the amount of unconverted light that escapes the device. In one example of FIG. 5, active region 44 emits blue light, and luminescent material layer 49 includes two phosphors, one that absorbs the blue light and emits green light, and one that absorbs either the blue or the green light and emits red light. The converted light mixes with the unconverted light to make composite light that appears white.

In the embodiments illustrated in FIGS. 3 and 5, photonic band gap material 50 is deposited on the surface of a flip chip light emitting device through which light is extracted from the device. In some embodiments, the photonic band gap material may be spaced apart from the device, and the luminescent material layer may be spaced apart from the photonic band gap material. Though the devices illustrated in FIGS. 3 and 5 show both the photonic band gap material and the luminescent material extending over the sides of the device, in other embodiments either or both materials may cover only the top surface of the device. Such embodiments may simplify application of the photonic band gap material and the luminescent material, by allowing these materials to be deposited before a wafer of light emitting devices is diced into individual devices.

The use of a photonic band gap structure to prevent converted light from reentering the light emitting device is particularly useful for devices requiring conversion of a significant portion of light emitted by the active region. Examples include phosphor conversion of UV or blue primary light to make a predominantly green-, yellow-, or red-emitting device, or partial conversion of blue primary light using green-, yellow-, and/or red-emitting phosphors to make a white LED with a color temperature (CCT) less than 5500 K. Typically, high conversion is achieved by heavily "loading" the device with luminescent material, such that less than 10% of the light emitted by the active region escapes the device unconverted by the luminescent material layer. Such heavy loading increases the probability of both converted and unconverted photons being reflected back into the chip, reducing the overall efficiency of the device.

Figure 6:
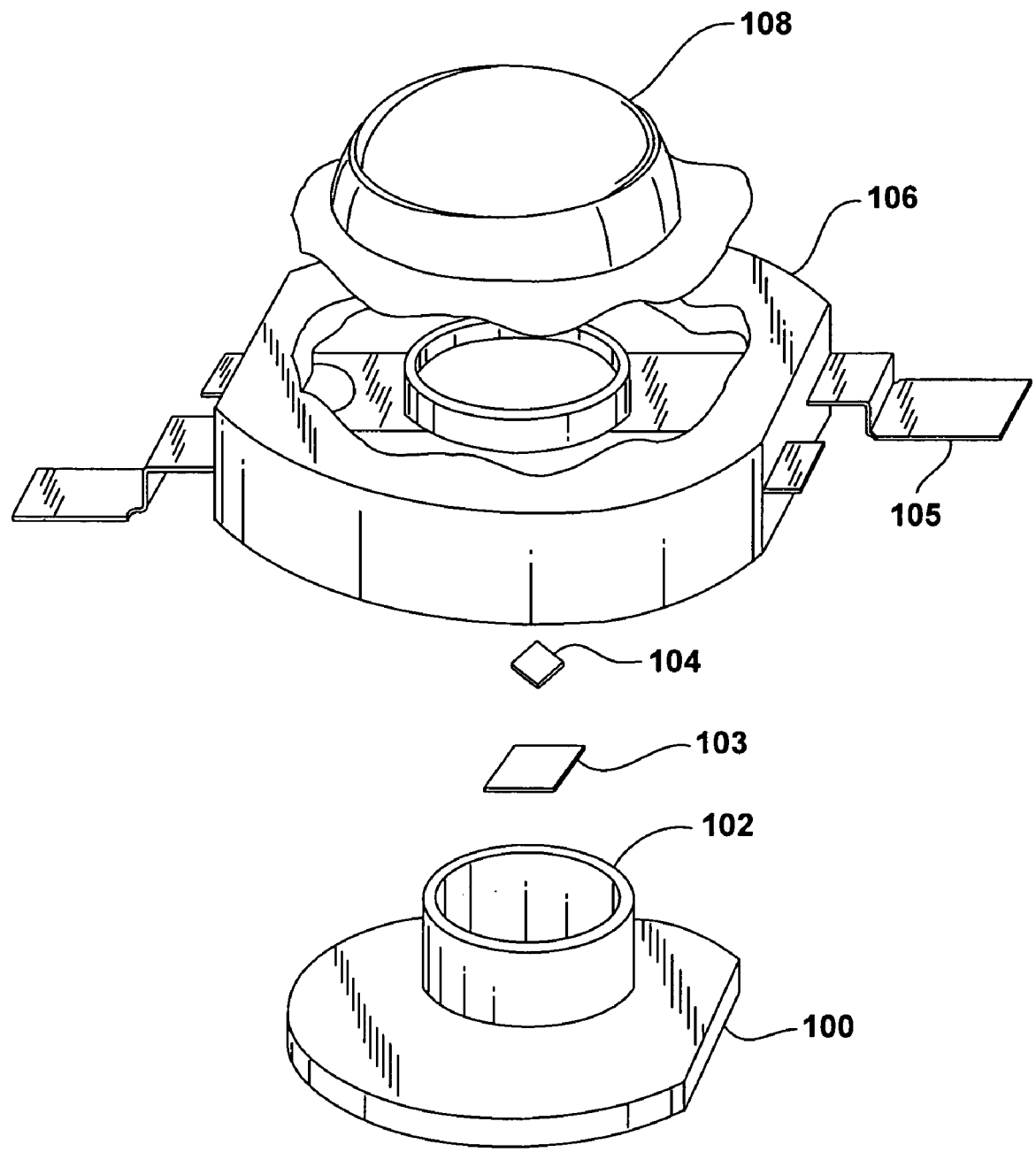
FIG. 6 is an exploded view of a packaged light emitting device.

FIG. 6 is an exploded view of a packaged light emitting device. A heat-sinking slug 100 is placed into an insert-molded leadframe 106. The insert-molded leadframe 106 is, for example, a filled plastic material molded around a metal frame 105 that provides an electrical path to the device. Slug 100 may include an optional reflector cup 102. Alternatively, slug 100 may provide a pedestal without a reflector cup. The light emitting device die 104, which may be any of the devices described above, is mounted directly or indirectly via a thermally conducting submount 103 to slug 100. An optical lens 108 may be added.

Having described the invention in detail, those skilled in the art will appreciate that, given the present disclosure, modifications may be made to the invention without departing from the spirit of the inventive concept described herein. For example, though FIGS. 3 and 5 illustrate flip chip devices, other device configurations may be used. In addition, though the examples described above refer to III-nitride devices, devices of other materials systems including other III–V materials systems and II–VI materials systems may be used. Further, though the examples described above refer to three-dimensional photonic band gap materials, two-dimensional photonic band gap materials may be used. Therefore, it is not intended that the scope of the invention be limited to the specific embodiments illustrated and described.

What is being claimed is:

1. A structure comprising:
   a semiconductor light emitting device including an active region capable of emitting first light having a first peak wavelength;
   a luminescent material disposed in the path of at least a portion of the first light, wherein the luminescent material is capable of emitting second light having a second peak wavelength; and
   a photonic band gap material disposed between the light emitting device and the luminescent material, wherein the photonic band gap material comprises a periodic variation in index of refraction in at least two dimensions, and wherein the photonic band gap material is capable of transmitting the first light and reflecting the second light.

2. The structure of claim 1 wherein the semiconductor light emitting device comprises at least one III-nitride layer.

3. The structure of claim 1 wherein the first light comprises light having a peak wavelength less than 490 nm.

4. The structure of claim 1 wherein the luminescent material is a phosphor.

5. The structure of claim 1 wherein the photonic band gap material contacts a surface of the semiconductor light emitting device.

6. The structure of claim 1 wherein the luminescent material contacts a surface of the photonic band gap material.

7. The structure of claim 1 wherein the photonic band gap material is spaced apart from the semiconductor light emitting device.

8. The structure of claim 1 wherein the luminescent material is spaced apart from the photonic band gap material.

9. The structure of claim 1 wherein the photonic band gap material comprises a periodic variation in index of refraction in three dimensions.

10. The structure of claim 1 wherein the photonic band gap material comprises a plurality of spheres.

11. The structure of claim 10 wherein the spheres are polystyrene.

12. The structure of claim 1 wherein the photonic band gap material comprises a plurality of material layers, each material layer including a periodic array of holes.

13. The structure of claim 12 wherein the holes are filled with air.

14. The structure of claim 12 wherein the material layers are one of crystalline, glass, and dielectric.

15. The structure of claim 12 wherein the periodic array of holes in each material layer is offset from the periodic arrays of holes in the material layers above and below.

16. The structure of claim 1 wherein the first light is blue and the second light is red or green.

17. The structure of claim 1 wherein the first light is UV and the second light is one of blue, green, and red.

18. The structure of claim 1 wherein the first light is blue and the second light is yellow.

19. The structure of claim 1 wherein:
   the luminescent material absorbs a portion of the first light; and
   the luminescent material is configured such that at least 90% of the first light is absorbed by the luminescent material.

20. The structure of claim 1 wherein:
   the luminescent material absorbs a portion of the first light; and
   the luminescent material is configured such that at least 50% of the first light is absorbed by the luminescent material.

21. The structure of claim 1 wherein the luminescent material is a first luminescent material, the structure further comprising a second luminescent material capable of emitting third light having a third peak wavelength.

22. The structure of claim 21 wherein the first light is blue, the second light is yellow or green, and the third light is red.

23. The structure of claim 21 wherein the first light is UV, the second light is blue, and the third light is yellow.

24. The structure of claim 21 further comprising a third luminescent material capable of emitting fourth light having a fourth peak wavelength, wherein the first light is UV, the second light is blue, the third light is green, and the fourth light is red.

25. The structure of claim 1 wherein the luminescent material is configured such that a portion of the first light escapes the structure without being incident on the luminescent material.

26. The structure of claim 1 wherein the photonic band gap material is capable of transmitting the first light and reflecting the second light regardless of the angle of incidence of the first and second light on the photonic band gap material.

27. The structure of claim 1 wherein the photonic band gap material is configured to transmit at least 90% of the first light incident on the photonic band gap material.

28. The structure of claim 1 wherein the photonic band gap material is configured to reflect at least 50% of the secondary light incident on the photonic band gap material.

29. The structure of claim 1 wherein the photonic band gap material is configured to reflect at least 90% of the secondary light incident on the photonic band gap material.

* * * * *